(12) United States Patent
Hashimoto et al.

(10) Patent No.: US 7,719,800 B2
(45) Date of Patent: May 18, 2010

(54) MAGNETORESISTIVE EFFECT ELEMENT AND MANUFACTURING METHOD THEREOF, AND MAGNETIC HEAD, MAGNETIC REPRODUCING APPARATUS, AND MAGNETIC MEMORY USING THE SAME

(75) Inventors: Susumu Hashimoto, Tokyo (JP); Hiromi Fuke, Yokohama (JP); Hitoshi Iwasaki, Yokosuka (JP); Masaaki Doi, Sendai (JP); Kousaku Miyake, Sendai (JP); Masashi Sahashi, Natori (JP)

(73) Assignees: Kabuhsiki Kaisha Toshiba, Tokyo (JP); TDK Corporation, Tokyo (JP)

( * ) Notice: Subject to any disclaimer, the term of this patent is extended or adjusted under 35 U.S.C. 154(b) by 623 days.

(21) Appl. No.: 11/644,904

(22) Filed: Dec. 26, 2006

(65) Prior Publication Data

US 2007/0159733 A1 Jul. 12, 2007

(30) Foreign Application Priority Data

Jan. 11, 2006 (JP) ............................. P2006-003666

(51) Int. Cl.
*G11B 5/127* (2006.01)
(52) U.S. Cl. ................................... 360/324
(58) Field of Classification Search ................. 360/324, 360/324.1, 324.11, 324.2, 324.12
See application file for complete search history.

(56) References Cited

U.S. PATENT DOCUMENTS

| | | | | |
|---|---|---|---|---|
| 5,130,867 A | * | 7/1992 | Ohashi ......................... | 360/75 |
| 5,169,703 A | * | 12/1992 | Miyazaki et al. ............. | 428/141 |
| 5,364,698 A | * | 11/1994 | Kotani .......................... | 428/323 |
| 5,500,296 A | * | 3/1996 | Inoue et al. .................. | 428/408 |
| 5,715,121 A | | 2/1998 | Sakakima et al. | |
| 5,887,336 A | * | 3/1999 | Watanabe ................ | 29/603.16 |
| 5,936,402 A | | 8/1999 | Schep et al. | |
| 5,942,309 A | | 8/1999 | Kamijo | |
| 6,087,004 A | * | 7/2000 | Tanaka et al. ............... | 428/403 |
| 6,146,740 A | * | 11/2000 | Birukawa et al. ........... | 428/141 |
| 6,171,693 B1 | | 1/2001 | Lubitz et al. | |

(Continued)

FOREIGN PATENT DOCUMENTS

JP 2000-293982 10/2000

(Continued)

OTHER PUBLICATIONS

García et al., *Magnetoresistance in excess of 200% in Ballistic Ni Nanocontacts at Room Temperature and 100 Oe*, Physical Review Letters, vol. 82, No. 14, Apr. 5, 1999, pp. 2923-2926.

(Continued)

*Primary Examiner*—Allen T Cao
(74) *Attorney, Agent, or Firm*—Nixon & Vanderhye, PC

(57) ABSTRACT

An example magnetoresistive effect element includes a magnetoresistive effect film including a magnetization pinned layer, a magnetization free layer, and an intermediate layer interposed therebetween and having a magnetic region and a nonmagnetic region whose electrical resistance is higher than the magnetic region. A sense current is passed to the magnetoresistive effect film in a direction substantially perpendicular to the film plane thereof. The magnetic region of the intermediate layer penetrates the nonmagnetic region locally and extends in the direction substantially perpendicular to the film plane. The nonmagnetic region contains a nonmagnetic metallic element having a larger surface energy than a magnetic metallic element contained in the magnetic region.

10 Claims, 12 Drawing Sheets

U.S. PATENT DOCUMENTS

| | | |
|---|---|---|
| 6,469,926 B1 | 10/2002 | Chen |
| 6,473,275 B1 | 10/2002 | Gill |
| 6,560,077 B2 | 5/2003 | Fujiwara et al. |
| 6,784,509 B2 | 8/2004 | Yuasa et al. |
| 6,816,347 B2 * | 11/2004 | Koi et al. ............... 360/324.11 |
| 6,937,447 B2 | 8/2005 | Okuno et al. |
| 7,218,484 B2 | 5/2007 | Hashimoto et al. |
| 7,289,305 B2 | 10/2007 | Fuke et al. |
| 2001/0009063 A1 | 7/2001 | Saito et al. |
| 2001/0013999 A1 * | 8/2001 | Koi et al. ............... 360/324.11 |
| 2002/0004147 A1 | 1/2002 | Ueno et al. |
| 2002/0051380 A1 | 5/2002 | Kamiguchi et al. |
| 2002/0054461 A1 | 5/2002 | Fujiwara et al. |
| 2002/0058158 A1 | 5/2002 | Odagawa et al. |
| 2002/0135935 A1 | 9/2002 | Covington |
| 2003/0104249 A1 | 6/2003 | Okuno et al. |
| 2003/0123200 A1 | 7/2003 | Nagasaka et al. |
| 2003/0168673 A1 | 9/2003 | Yuasa et al. |
| 2004/0086751 A1 | 5/2004 | Hasegawa et al. |
| 2004/0169963 A1 | 9/2004 | Okuno et al. |
| 2004/0201929 A1 | 10/2004 | Hashimoto et al. |
| 2005/0002126 A1 | 1/2005 | Fujiwara |
| 2005/0042478 A1 | 2/2005 | Okuno et al. |
| 2005/0094327 A1 | 5/2005 | Okuno et al. |
| 2005/0201020 A1 | 9/2005 | Fuke et al. |
| 2006/0024531 A1 * | 2/2006 | Murakami .................. 428/827 |
| 2006/0124585 A1 * | 6/2006 | Suwa et al. .................. 216/22 |
| 2007/0159733 A1 | 7/2007 | Hashimoto et al. |

FOREIGN PATENT DOCUMENTS

| | | |
|---|---|---|
| JP | 2001-143227 | 5/2001 |
| JP | 2002-074626 | 3/2002 |
| JP | 3293437 | 4/2002 |
| JP | 2003-204095 | 7/2003 |
| JP | 2005-033216 | 2/2005 |
| JP | 2005-259976 | 9/2005 |
| JP | 2005-285936 | 10/2005 |
| WO | 97-47982 | 12/1997 |

OTHER PUBLICATIONS

Versluijs et al., *Magnetoresistance of Half-Metallic Oxide Nanocontacts*, Physical Review Letters, vol. 87, No. 2, Jul. 9, 2001, pp. 026601-1 to 026601-4.

García et al., *Balistic magnetoresistance in nanocontacts electrochemically grown between macro- and microscopic ferromagnetic electrodes*, Applied Physics Letters, vol. 80, No. 10, Mar. 11, 2002, pp. 1785-1787.

Chopra et al., *Ballistic magnetoresistance over 3000% in Ni nanocontacts at room temperature*, Physical Review B 66, 2002, pp. 02403-1 to 02403-3.

Howson et al.: "Magnetic multilayers of Fe/Au: role of the electron mean free path,", *J. Phys.: Condens. Matter*, 11, pp. 5717-5722 (1999).

Fukuzawa et al., "Specular spin-valve films with an FeCo nanaooxide layer by ion-assisted oxidation", May 15, 2002, J. App. Phys. vV. 91 No. 10 p. 6684. (abstract).

B. Dieny et al., "Giant magnetorsistance of magnetically soft sanwiches: Dependence on temperature and on layer thickness", Physical Review B, vol. 45 No. 2, pp. 806-813, (Jan. 1, 1992).

B. Dieny et al. , Magnetotransport properties of magnetically soft spin-valve structures (invited), J. Applied Physics, vol. 69, pp. 4774-4779, (Apr. 15, 1991).

* cited by examiner

MAGNETORESISTIVE EFFECT ELEMENT AND MANUFACTURING METHOD THEREOF, AND MAGNETIC HEAD, MAGNETIC REPRODUCING APPARATUS, AND MAGNETIC MEMORY USING THE SAME

CROSS-REFERENCE TO RELATED APPLICATION

This application is based upon and claims the benefit of priority from the prior Japanese Patent Application No. 2006-003666, filed on Jan. 11, 2006; the entire contents of which are incorporated herein by reference.

BACKGROUND OF THE INVENTION

1. Field of the Invention

The present invention relates to a magnetoresistive effect element and a manufacturing method thereof, and a magnetic head, a magnetic reproducing apparatus, and a magnetic memory using the mangetresistive effect element.

2. Description of the Related Art

Sensitivity improvement of a GMR (Giant Magnetoresistive Effect) head supporting a magnetic recording density of an HDD (Hard Disk Drive) is near to reach a limit. A renewed high sensitive reproducing head becomes necessary to increase a recording density over 100 gigabits per one square inch. A GMR head making use of a tunnel effect (TMR (Tunneling Magnetoresistive Effect) head) can be cited as one candidate thereof. However, the TMR head also includes a principle problem that resistance increases in accordance with the increase of the recording density.

A GMR head having so-called a CPP (Current Perpendicular to Plane) structure in which a sense current is passed in a film plane perpendicular direction of a magnetoresistive effect film is expectable, to realize the recording density of 200 gigabits or more. According to the GMR head having the CPP structure, it is possible to obtain an MR change ratio of approximately 10 times of a CIP (Current in Plane) structure. Further, the GMR head having the CPP structure also has an advantage that the resistance thereof is low compared to the TMR head.

However, even in the CPP type GMR head, a resistance change ratio thereof remains in approximately 15% at maximum, and a limit of the resistance change ratio in principle is also considered to be approximately several 10%. A miniaturization of recording bits is advanced owing to the increase of the recording density in a magnetic recording field. As a result, it becomes difficult to obtain sufficient signal strength. Consequently, magnetoresistive effect material with higher sensitivity is expected, and a requirement for the GMR head showing a larger resistance change ratio goes higher and higher.

Recently, a magnetic microcontact in which two acicular nickels are faced, or a magnetic microcontact in which two magnetites are brought into contact is reported as the magnetoresistive effect material showing the resistance change ratio of 100% or more. These materials show the large resistance change ratio, but every magnetic microcontact is created by facing two ferromagnetic materials processed into acicular states or triangle states. Therefore, it is difficult to apply to a practical GMR head as it is. Further, a magnetic microcontact in which two slim nickel wires are disposed in T-shape and a micro column is grown at a contact portion by using an electrodeposition method is reported. It is also difficult to apply this magnetic microcontact to the GMR head.

There are many opinions as for a beginning of the large resistance change ratio resulting from the magnetic microcontact, but a ballistic conduction effect at a contact portion can be cited as one of the beginning. It is conceivable that the magnetic microcontact exhibits an extremely large magnetoresistive effect (Ballistic Magnetoresistive Effect (BMR)) by generating a ballistic conduction between magnetic layers. In a manufacturing process of a spin-valve film in which the nonmagnetic intermediate layer is interposed between two ferromagnetic layers (magnetization pinned layer and magnetization free layer), a process becomes necessary to constitute a nonmagnetic intermediate layer practically with an insulator, and to form at least one micromagnetic region of nano-size within a part of the nonmagnetic intermediate layer to apply the above-stated BMR to a magnetic head.

When the micromagnetic region is formed by a normal lithography process, the minimum size thereof remains to be at approximately 10 nm even though an electron-beam lithography apparatus capable of realizing the finest pattern is used. Accordingly, it is difficult to create the micromagnetic region (magnetic point contact) with the size of several nm required for the exhibition of the BMR. In JP-A 2003-204095 (KOKAI), it is described that a hole with a maximum width of 20 nm or less is provided at an insulating layer disposed between a magnetization pinned layer and a magnetization free layer, and a magnetic microcontact is formed by filling a ferromagnetic material in the hole. However, it is difficult to form the magnetic microcontact capable of exhibiting the BMR with good repeatability by using the method as stated above.

The magnetic microcontact has a possibility to show a large magnetoresistive change ratio. However, the conventional magnetic microcontact has a structure in which a precise control at the time of creation is difficult, and further, a structure which is difficult to apply to the magnetic head. It is necessary to develop a structure and a manufacturing method of the magnetic microcontact capable of mass production and having good controllability to apply the BMR based on the magnetic microcontact to the magnetic head and so on.

BRIEF SUMMARY OF THE INVENTION

A magnetoresistive effect element according to an aspect of the present invention includes: a magnetoresistive effect film including, a pinned layer having a ferromagnetic film of which magnetization direction is fixed substantially in one direction, a free layer having a ferromagnetic film of which magnetization direction changes in accordance with an external magnetic field, and an intermediate layer which is interposed between the pinned layer and the free layer, and has a magnetic region and a nonmagnetic region whose electrical resistance is higher than the magnetic region, and in which the nonmagnetic region contains a nonmagnetic metallic element having a larger surface energy than a magnetic metallic element contained in the magnetic region; and a pair of electrodes provided to pass a sense current in a direction substantially perpendicular to a film plane of the magnetoresistive effect film.

A manufacturing method of a magnetoresistive effect element according to an aspect of the present invention includes: forming a first magnetic layer on a lower electrode; sequentially laminating a first layer containing a magnetic metallic element and a second layer containing a nonmagnetic metallic element whose surface energy is larger than the magnetic metallic element, on the first magnetic layer; supplying energy to a laminated film of the first layer and the second layer so as to accelerate a movement and a diffusion of atoms at the laminated film to form an intermediate layer having a nonmagnetic region containing the nonmagnetic metallic element, and a magnetic region containing the magnetic metallic element and penetrating the nonmagnetic region locally; forming a second magnetic layer on the intermediate layer; and disposing an upper electrode on the second magnetic layer to pass a sense current in a direction substantially perpendicular to a film plane of a magnetoresistive effect film including the first magnetic layer, the intermediate layer, and the second magnetic layer.

A magnetic head according to an aspect of the present invention includes a reproducing element including the magnetoresistive effect element according to the aspect of the present invention. A magnetic reproducing apparatus according to an aspect of the present invention includes a magnetic recording medium, and a magnetic head reproducing information magnetically recorded on the magnetic recording medium, and having the magnetoresistive effect element according to the aspect of the present invention. Further, a magnetic memory according to an aspect of the present invention includes the magnetoresistive effect element according to the aspect of the present invention, a write wiring storing information on the magnetoresistive effect element, and a read wiring reproducing information stored on the magnetoresistive effect element.

DETAILED DESCRIPTION OF THE INVENTION

Figure 1:
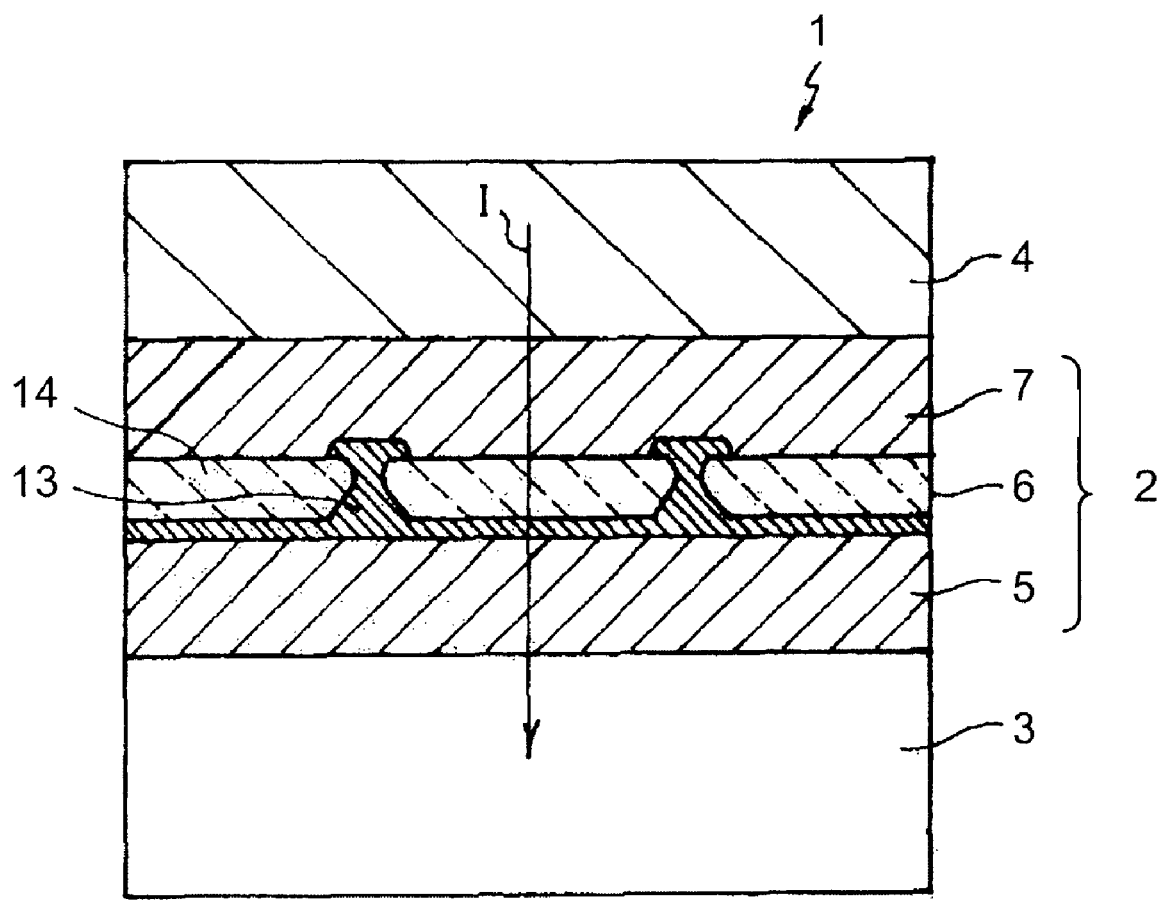
FIG. 1 is a sectional view showing a magnetoresistive effect element according to an embodiment.

Hereinafter, embodiments to carry out the present invention are described. As shown FIG. 1, a magnetoresistive effect element 1 according to an embodiment includes a magnetoresistive effect film 2 having a spin-valve structure. The spin-valve type magnetoresistive effect film 2 is disposed on a substrate 3 functioning as a lower electrode.

An upper electrode 4 is disposed on the spin-valve type magnetoresistive effect film 2. These upper and lower electrodes 3, 4 are provided so as to pass a sense current I in an approximately direction perpendicular to a film plane of the spin-valve type magnetoresistive effect film 2. Namely, the spin-valve type magnetoresistive effect element 1 shown in FIG. 1 has a CPP structure.

The spin-valve type magnetoresistive effect film 2 has a laminated film with a structure of a first magnetic layer 5, an intermediate layer 6, and a second magnetic layer 7. One of the first magnetic layer 5 and the second magnetic layer 7 is a magnetization pinned layer (pinned layer) having a ferromagnetic film of which magnetization direction is practically fixed in one direction. The other is a magnetization free layer (free layer) having a ferromagnetic film of which magnetization direction changes in accordance with an external magnetic field. Positions of the pinned layer and the free layer in a longitudinal direction are not particularly limited, and any of the pinned layer and the free layer may be disposed at a lower layer side.

Figure 2:
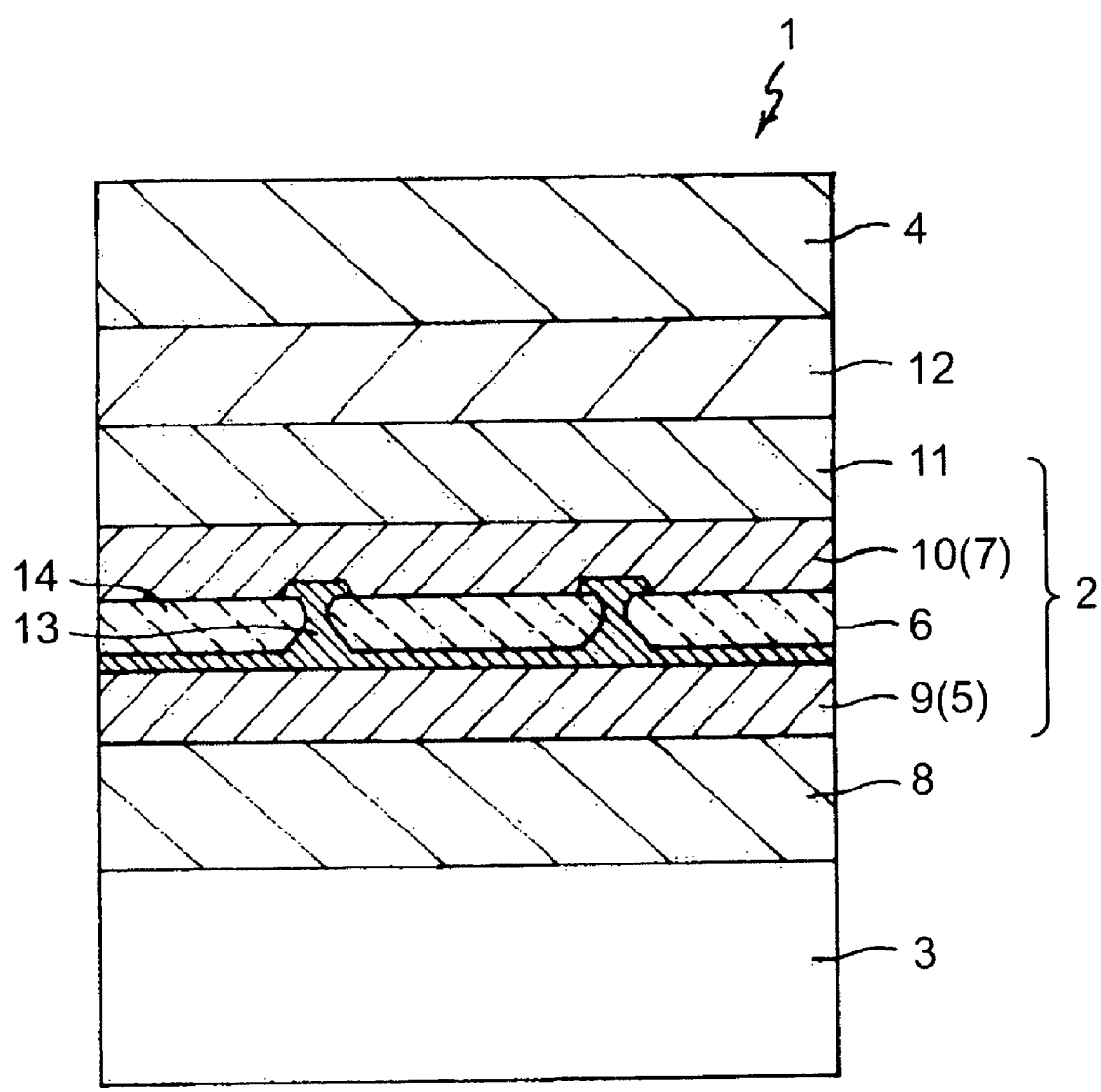
FIG. 2 is a sectional view showing a concrete example of a magnetoresistive effect film shown in FIG. 1.

FIG. 2 shows an example of a concrete structure of the spin-valve type magnetoresistive effect film 2. In the spin-valve type magnetoresistive effect film 2 shown in FIG. 2, the first magnetic layer 5 constitutes the free layer. A ferromagnetic film 9 functioning as the free layer 5 is formed on the substrate 3 serving also as the lower electrode via a under layer 8. The magnetization direction of the ferromagnetic film 9 changes in accordance with the external magnetic field such as a signal magnetic field, and therefore the ferromagnetic film 9 functions as the free layer 5.

The intermediate layer 6 is formed on the free layer 5, and the second magnetic layer 7 as the pinned layer is formed thereon. A ferromagnetic film 10 functioning as the pinned layer 7 is formed on the intermediate layer 6. An antiferromagnetic layer 11 composed of a Pt—Mn alloy, an Ir—Mn alloy, and so on is formed on the ferromagnetic film 10. The magnetization direction of the ferromagnetic film 10 formed on the intermediate layer 6 is practically fixed in one direction by an exchange bias magnetic field from the antiferromagnetic layer 11. Herewith, the ferromagnetic film 10 functions as the pinned layer 7.

The pinned layer 7 is not limited to the ferromagnetic film 10 with a single-layer structure shown in FIG. 2, but it may have a laminated structure. For example, the pinned layer 7 may have the laminated structure (synthetic structure) in which ferromagnetic films are disposed at both sides of a magnetization antiparallel coupling layer composed of Ru and so on. In such laminated structure, the magnetization direction of one ferromagnetic film is fixed in one direction by the antiferromagnetic layer. Further, the magnetizations of the ferromagnetic films with each other are coupled in the antiparallel state via the magnetization antiparallel coupling layer. Incidentally, the structure of the free layer 5 is also not limited to the single-layer structure, but the laminated structure including the ferromagnetic film can be applied.

Fe, Co, Ni, or alloys of these elements with each other, or alloys whose main constituents are these elements, and so on are applied to the ferromagnetic films 9, 10 constituting the free layer 5 and the pinned layer 7. It is preferable that the ferromagnetic films 9, 10 have good soft magnetic characteristics so that sensitivity is increased and a Barkhausen noise is eliminated when the magnetoresistive effect element 1 is used, for example, as a magnetic sensor. In particular, the free layer 5 is preferable to be laminated in a [111] direction which is a close-packed surface of a face-centered cubic lattice. However, the ferromagnetic films 9, 10 may partially be a body-centered cubic lattice, or may include a hexagonal close-packed lattice and other crystal structures. Film thicknesses of the free layer 5 and the pinned layer 7 are not particularly limited, but it is preferable to be 10 nm or less.

A protective layer 12 is formed on the antiferromagnetic layer 11, and the upper electrode 4 is further disposed thereon. Incidentally, the spin-valve type magnetoresistive effect film 2 in which the free layer 5 is disposed at the lower layer side is shown in FIG. 1 and FIG. 2, but the positions of the free layer 5 and the pinned layer 7 may be reversed. The structure in this case may be as follows: the substrate 3; the under layer 8; the antiferromagnetic layer 11; the first magnetic layer 5 functioning as the pinned layer; the intermediate layer 6; the second magnetic layer 7 functioning as the free layer; the protective layer 12; and the upper electrode 4. Further, the spin-valve type magnetoresistive effect film 2 may have a dual spin-valve structure having two intermediates layers.

The intermediate layer 6, interposed between the first magnetic layer (free layer in FIG. 2) 5 and the second magnetic layer (pinned layer in FIG. 2) 7, is constituted by a magnetic region 13 containing a magnetic metallic element and a nonmagnetic region 14 containing a nonmagnetic metallic element. The nonmagnetic region 14 relatively has a higher electrical resistance than the magnetic region 13. The nonmagnetic region 14 constitutes an entire shape of the intermediate layer 6, and it is disposed in a layer-state between the first magnetic layer 5 and the second magnetic layer 7. One or plural magnetic region(s) 13 is/are formed in a separated state within the nonmagnetic region 14.

Figure 3:
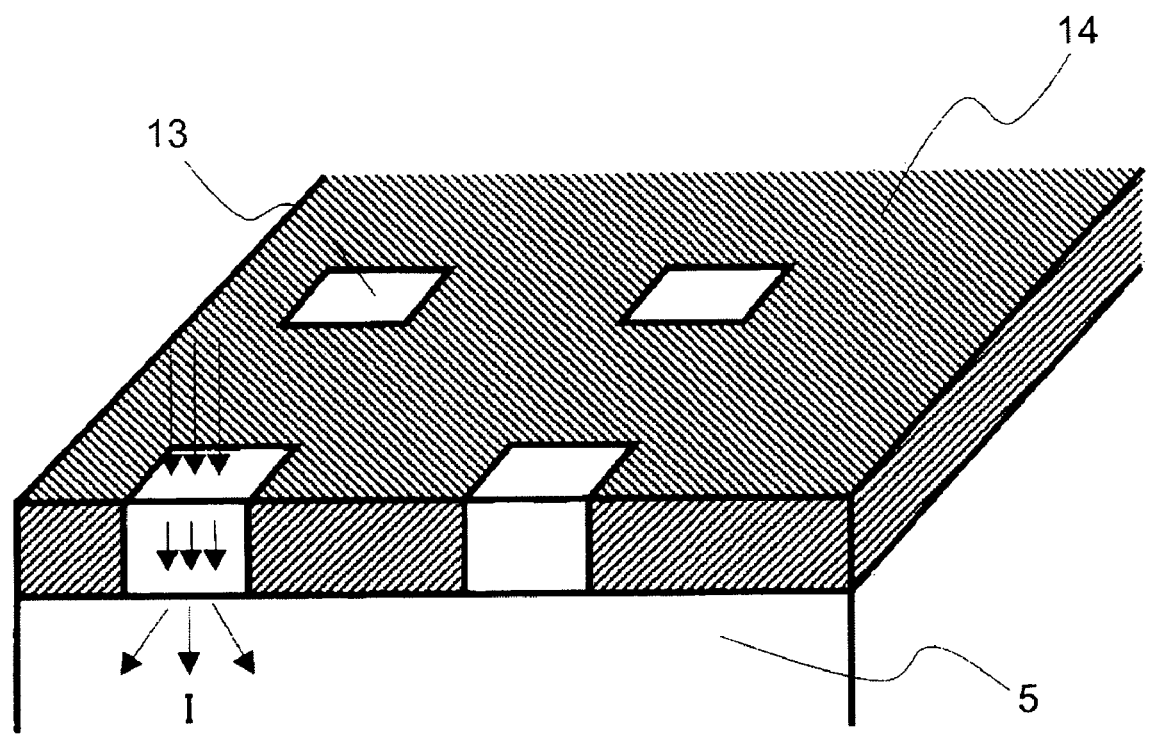
FIG. 3 is a view showing a planer structure of an intermediate layer shown in FIG. 1.

The magnetic region 13 penetrates the nonmagnetic region 14 locally and extends in a film plane perpendicular direction so as to connect the first magnetic layer 5 and the second magnetic layer 7. In plan view, one or plural magnetic region (s) 13 is/are locally dotted within the layer-state nonmagnetic region 14 as shown in FIG. 3. Further, an upper end portion of the magnetic region 13 exists while passing through the layer-state nonmagnetic region 14. The upper end portion of the magnetic region 13 passing through the nonmagnetic region 14 is preferable to spread our in a terrace form. However, a shape of the upper end portion of the magnetic region 13 is not limited to the above. It is possible to suppress a scattering of spins in a micro region if a slight part of the upper end portion of the magnetic region 13 goes through the layer-state nonmagnetic region 14 even if the amounts are a little.

The electric resistance of the magnetic region 13 is relatively lower than that of the nonmagnetic region 14, and the magnetic regions 13 are dotted locally within the nonmagnetic region 14. Consequently, the sense current I flows in the magnetic region 13 selectively. Namely, in a vicinity of the intermediate layer 6, the sense current I is confined toward the magnetic region 13, and the magnetic region 13 functions as a conduction portion. A film thickness of the intermediate layer 6 is preferable to be in a range from 0.5 nm to 5 nm. When the film thickness of the intermediate layer 6 is less than 0.5 nm, a practicality as the magnetoresistive effect element 1 deteriorates because a magnetic coupling force between the first magnetic layer 5 and the second magnetic layer 7 becomes too strong. When the film thickness of the intermediate layer 6 is more than 5 nm, a formability of the micro magnetic regions 13 deteriorates. Here, the film thickness of the intermediate layer 6 corresponds to the film thickness of the nonmagnetic region 14.

The magnetic region 13 contains at least one of magnetic metallic element selected from Fe, Co, and Ni. Further it is preferable that the magnetic region 13 has a metal-state to be functioned as the conduction portion. The magnetic region 13 is preferable to be composed of the above-stated magnetic metal or an alloy thereof. The nonmagnetic region 14 may be composed of the nonmagnetic metal, the alloy thereof, or the like as long as a sufficient difference of the electrical resistance can be secured between the magnetic region 13. However, it is preferable that the nonmagnetic region 14 is composed of an oxide, a nitride, a carbide, a fluoride, and so on of the nonmagnetic metallic element to increase the resistance of the nonmagnetic region 14. As the nonmagnetic metallic element, Mg, Ca, Ba, Sr, Y, Ti, Zr, Hf, V, Nb, Ta, Cr, Mo, W, Cu, Ag, Au, Al, and so on can be cited.

The nonmagnetic region 14 of this embodiment has the nonmagnetic metallic element having a larger surface energy than the magnetic metallic element composing the magnetic region 13. As the nonmagnetic metallic element as stated above, at least one selected from Nb, V, Ta, Mo, W, Ti, Zr, and Hf is exemplified. The nonmagnetic region 14 is preferable to be composed of the oxide, the nitride, the carbide, the fluoride, and soon of these nonmagnetic metallic elements.

The intermediate layer 6 having the magnetic region 13 and the nonmagnetic region 14 has a microstructure which is two-dimensionally phase separated as shown in FIG. 3, based on the difference of the surface energies of the magnetic metallic element and the nonmagnetic metallic element mainly composing the respective regions 13, 14. Concretely, energy is supplied based on a heating, an ion beam irradiation, and so on after at least two layers of the magnetic layer (first layer) and the nonmagnetic layer (second layer) having different surface energies are laminated. The microstructured body separated into two phases of the magnetic region 13 and the nonmagnetic region 14 can be realized by accelerating a movement and a diffusion of atoms between the films and on the film surface of the laminated film based on the energy supply.

Such microstructured layer plays a role as a conductive pass of a magnetic spin between the first magnetic layer (free layer in FIG. 2) 5 and the second magnetic layer (pinned layer in FIG. 2) 7, and as the intermediate layer (spacer layer) 6 controlling strength of the magnetic coupling. According to a phase separation mechanism based on the above-stated difference of the surface energies of constituent metallic elements, a structure in which the magnetic regions 13 are dotted as the micro regions within the nonmagnetic region 14 can be realized. In other words, a structure in which nano-bridges (spinnano-bridges) 13 are formed with magnetic metallic atoms having conductivity within the nonmagnetic region 14 having a relatively high electrical resistance can be realized.

The micro magnetic region 13 having conductivity operates as a magnetic microcontact between the first magnetic layer 5 and the second magnetic layer 7. Accordingly, when the sense current I is flowed in an approximately direction perpendicular to the film plane of the magnetoresistive effect film 2, it becomes possible to exhibit a large magnetoresistive effect (BMR) based on a ballistic conductive effect at the magnetic region 13, by changing the magnetization direction of the free layer (for example, the first magnetic layer 5) by the external magnetic field such as the signal magnetic field. Consequently, it becomes possible to realize the magnetoresistive effect element 1 showing a large resistance change ratio based on the BMR by applying the spin-valve type magnetoresistive effect film 2 having the practical CPP structure.

Further, an upper end portion of the magnetic region (spin nano-bridge) 13 passes through the nonmagnetic region 14, and, for example, spreads on the layer-state nonmagnetic region 14 in the terrace form. Herewith, an interface between the second magnetic layer 7 and the magnetic region 13 does not exist at the minimum portion of the magnetic region 13 exhibiting the BMR effect. The scattering of the spins at the interface generally becomes a deterioration cause of the magnetoresistive effect, and in particular, the scattering at the exhibition position of the BMR becomes a problem in case of the BMR. According to the magnetic region 13 whose upper end portion exists while passing through the nonmagnetic region 14, even if the scattering of the spins is occurred at the interface with the second magnetic layer 7, the scattering does not directly affect the exhibition portion of the BMR. Consequently, it becomes possible to obtain the resistance change ratio based on the BMR well and with good repeatability.

It is preferable that the micro magnetic region 13 has a minimum size in a range of 0.1 times to 5 times relative to the film thickness of the intermediate layer 6 to make the magnetic region 13 function as the magnetic microcontact. In the magnetic region 13 which functions as the conductive pass of the magnetic spin, the minimum size shows the two-dimensional size of the narrowest portion of the conductive pass. When the cross-sectional form of the magnetic region 13 is circular, the minimum size is equivalent to a diameter of the narrowest portion (a minimum diameter). When the cross-sectional form of the magnetic region 13 is except circular, the minimum size is equivalent to a diameter of the circular in which the narrowest portion is inscribed. Concretely, the minimum size of the magnetic region 13 is preferable to be 5 nm or less, further to be 2 nm or less. When the minimum size of the spin nano-bridge 13 is less than 0.1 times of the intermediate layer 6, there is a possibility that the spin nano-bridge 13 cannot be made function as the conductive pass of the magnetic spin. On the other hand, when the minimum size of the spin nano-bridge 13 is over 5 times of the film thickness of the intermediate layer 6, the practicality as the magnetoresistive effect element 1 deteriorates because the magnetic coupling force between the free layer (5) and the pinned layer (7) becomes too strong.

As stated above, the magnetic coupling force between the free layer and the pinned layer can be controlled by setting the minimum size of the micro magnetic region (spin nano-bridge) 13 within the range of 0.1 times to 5 times relative to the film thickness of the intermediate layer 6. In the magnetoresistive effect element 1 of this embodiment, the magnetic region 13 is formed within the nonmagnetic region 14, based on the movement and diffusion mechanism of atoms resulting from the difference of the surface energies of the constitutional elements. Consequently, the microstructure having the respective regions 13, 14 can be obtained easily, and in addition, a proportion, a distribution, and so on can be controlled.

Namely, it becomes possible to control the size and interval of the magnetic region 13 based on a film thickness ratio of the laminated film and diffusion conditions (for example, a substrate temperature, a plasma irradiation condition and an ion irradiation condition of rare gas such as Ar) to be a formation source of the intermediate layer (microstructured layer) 6, by using the difference of the surface energies of the constitutional elements. Further, the proportion of the magnetic region 13 occupying within the microstructured layer 6 can be controlled with high accuracy, because the dispersion of the constitutional element (magnetic metallic element) is small. Accordingly, the micro magnetic region (spin nano-bridge) 13 can be obtained with good repeatability and controllability.

The intermediate layer 6 having the above-stated microstructure is formed, for example, as described bellow. A forming process of the intermediate layer 6 having the magnetic region 13 and the nonmagnetic region 14 is described with reference to FIG. 4A, FIG. 4B, FIG. 4C, FIG. 5A, FIG. 5B, and FIG. 5C.

Figure 4A:
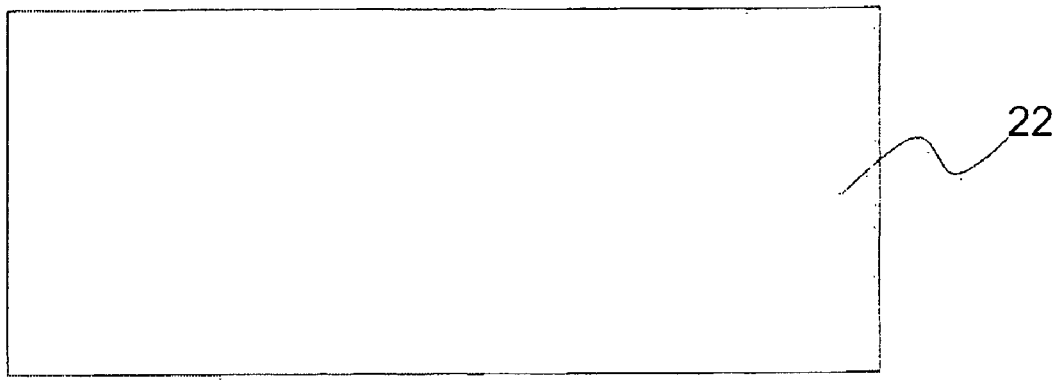
FIG. 4A, FIG. 4B, and FIG. 4C are plan views showing a forming process of the intermediate layer shown in FIG. 1.
Figure 5A:
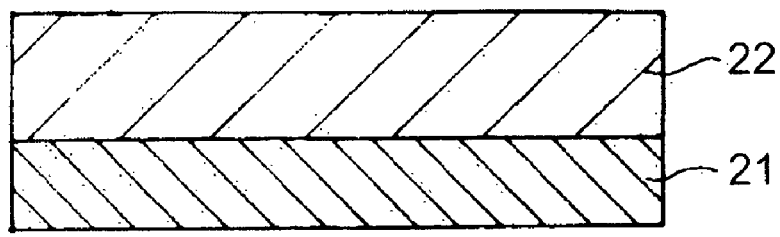
FIG. 5A, FIG. 5B, and FIG. 5C are sectional views of FIG. 4A, FIG. 4B, and FIG. 4C.

At first, a first layer 21 containing a magnetic metallic element M and a second layer 22 containing a nonmagnetic metallic element N are sequentially laminated on the first magnetic layer 5 to be a base of the intermediate layer 6, as shown in FIG. 4A and FIG. 5A. These respective metallic layers 21, 22 are deposited in a thin-film state by using, for example, a sputtering method, a laser deposition method, and so on. A film thickness ratio of the first and second layers 21, 22 are not particularly limited. As stated above, at least one kind selected from Fe, Co, and Ni is used for the magnetic metallic element M. An element having a larger surface energy than the magnetic metallic element M is used for the nonmagnetic metallic element N.

Figure 6:
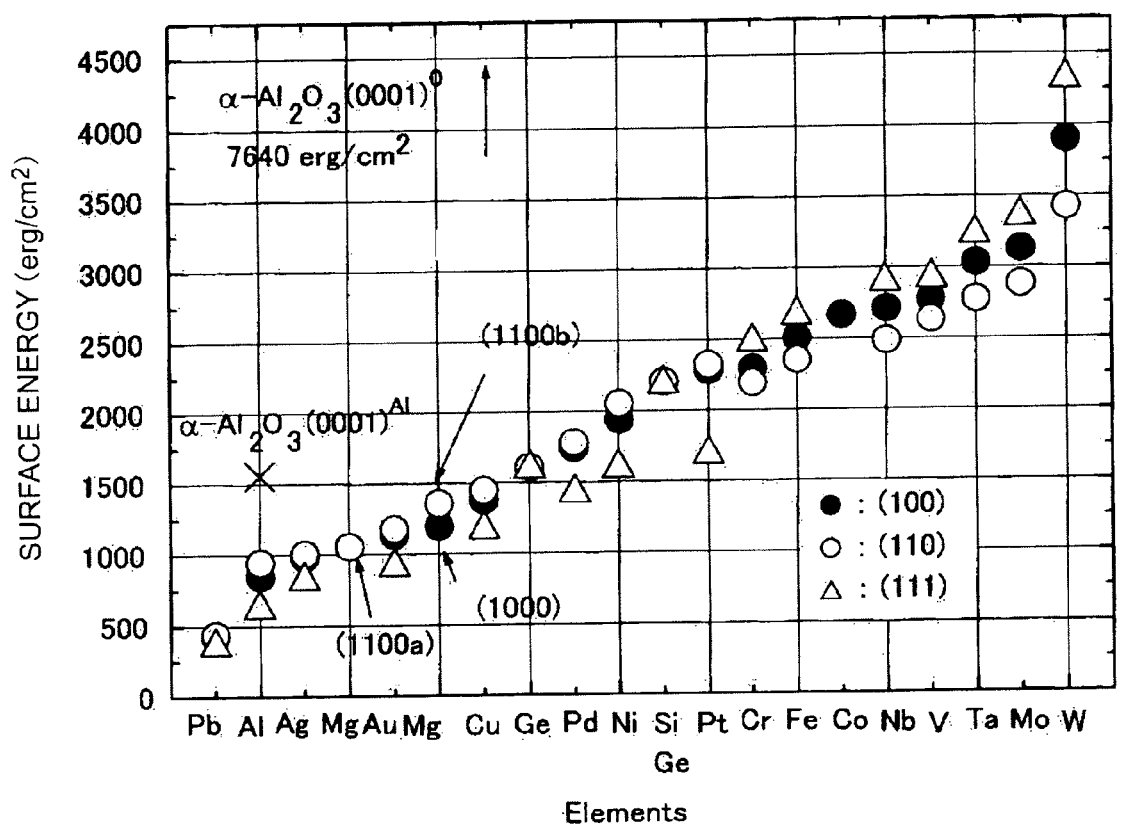
FIG. 6 is a view showing surface energies of various elements.

When the surface energy of the magnetic metallic element M is set as $Es_1$, and the surface energy of the nonmagnetic metallic element N is set as $Es_2$, a metallic element having the surface energy satisfying a condition of $Es_2 > Es_1$ is used for the nonmagnetic metallic element N. Surface energies Es of various metallic elements are shown in FIG. 6. As shown in FIG. 6, the surface energies Es are different by each metallic element, and they show a trend to be increased by oxidation. It is preferable that the nonmagnetic metallic element N is at least one selected from Nb, V, Ta, Mo, W, Ti, Zr and Hf considering that at least one selected from Fe, Co, and Ni is used as the magnetic metallic element M.

The laminated film (metallic laminated film) of the first layer 21 and the second layer 22 are separated into the respective layers just after the deposition as shown in FIG. 4A and FIG. 5A, and respectively have approximately uniform compositions. Energy is supplied to the laminated film so as to accelerate the movement and the diffusion of atoms between films and on the film surface of the laminated film. The energy supplying process is performed by an annealing process, an ion beam irradiation process, a plasma irradiation process, or the like. Other processes than the above can be applied as the energy supplying process as long as the movement and the diffusion of atoms can be accelerated.

Figure 4B:
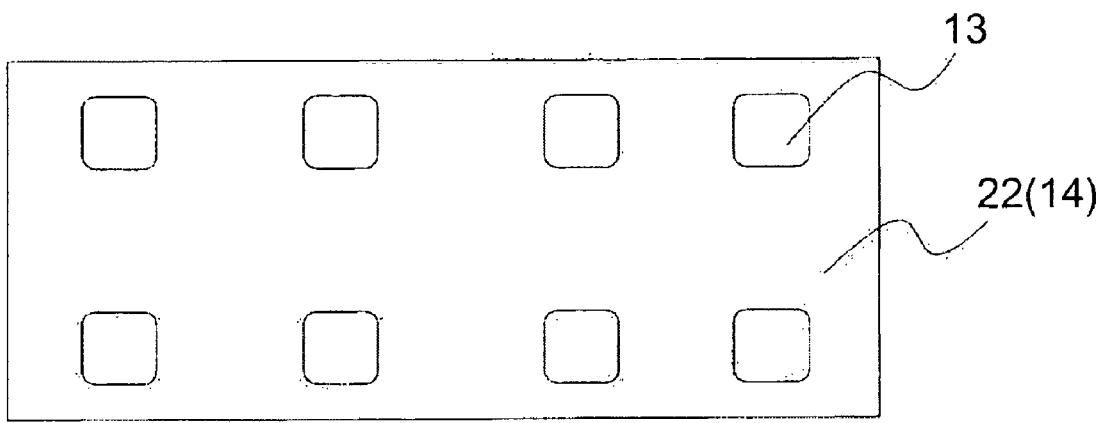
Figure 5B:
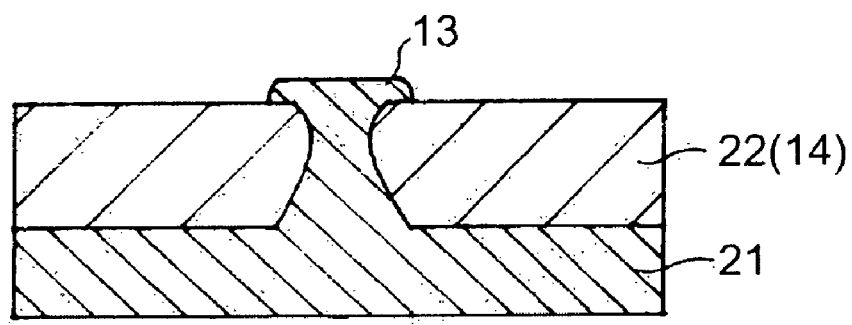

The energy as above-stated is supplied to the laminated film, then the second layer 22 having the large surface energy tries to be stable by aggregating nonmagnetic metallic element N to thereby degrease the surface energy. The nonmagnetic metallic element N aggregates, and thereby, gaps are generated at the second layer 22. The magnetic metallic element M having the smaller surface energy than the nonmagnetic metallic element N is absorbed into the gaps. The absorption of the magnetic metallic element M also occurs via crystal grain boundaries of the second layer 22. By absorbing the magnetic metallic element M, the magnetic regions 13 locally penetrating the second layer 22 constituting the nonmagnetic region 14, and extending in the film plane perpendicular direction are formed, as shown in FIG. 4B and FIG. 5B.

At this time, a supply amount, a supply time, and so on of the energy for the laminated film are controlled, and thereby, the magnetic metallic element M absorbed into the gaps of the second layer 22 are diffused in the terrace form on the surface of the second layer 22 (nonmagnetic region 14). The upper end portions of the magnetic regions 13 composed of the magnetic metallic element M are to exist while passing through the second layer 22 (nonmagnetic region 14), even if the magnetic metallic elements M do not diffuse in the terrace form. Herewith, it becomes possible to suppress the scattering of the spins in the micro region which has a bad effect on the exhibition of the BMR.

The energy supplying process to the laminated film can be performed by, for example, the annealing process in high temperature for a long time. A process temperature and a process time are set appropriately within a range in which the normal diffusion does not occur between the first layer 21 and the second layer 22, based on the difference of the surface energies of the magnetic metallic element M and the nonmagnetic metallic element N. For example, the larger the difference of the surface energies are, the larger the absorbing force becomes, and therefore, the process time can be shortened that much. Further, an absorbing phenomenon of the magnetic metallic element M occurs even if the process temperature is relatively low. The temperature and the time of the annealing process are adjusted appropriately based on a combination of the first layer 21 and the second layer 22.

The absorbing phenomenon of the magnetic metallic element M can be generated by irradiating the ion beam to the laminated film. The energy, to generate the gaps within the second layer 22 formed in the thin-film state, can be supplied based on the irradiation of the ion beam. It is preferable to use a rare gas element such as Argon (Ar), Xenon (Xe), and Krypton (Kr) as the ion beam. Irradiation conditions of the ion beam can be appropriately selected within a range in which remarkable etching does not occur in the magnetic metallic element M and the nonmagnetic metallic element N composing the intermediate layer 6.

Figure 7A:
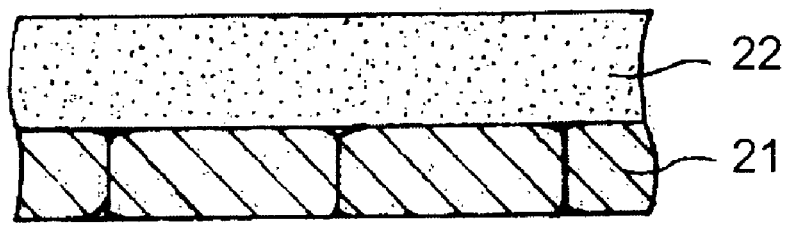
FIG. 7A, FIG. 7B, and FIG. 7C are views showing an absorbing phenomenon in the forming process of the intermediate layer.
Figure 7B:
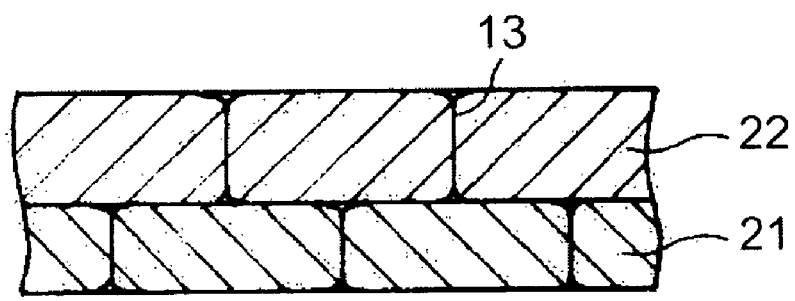

Further, the absorbing phenomenon of the magnetic metallic element M can be generated more remarkably by changing crystalline states of the first layer 21 and the second layer 22. As shown in FIG. 7A, the first layer 21 composed of the magnetic metallic element M is made to be a crystalline phase, and the second layer 22 composed of the nonmagnetic metallic element N is made to be an amorphous phase. The second layer 22 is composed of the amorphous phase not having a gain boundary just after the deposition. The energy is supplied to the laminated film by performing the annealing process, the ion beam irradiation process, and so on, and then, a change of a state from the amorphous phase to the crystalline phase occurs in the second layer 22 to thereby form crystal grain boundaries B in the second layer 22 at that time, as shown in FIG. 7B.

Figure 7C:
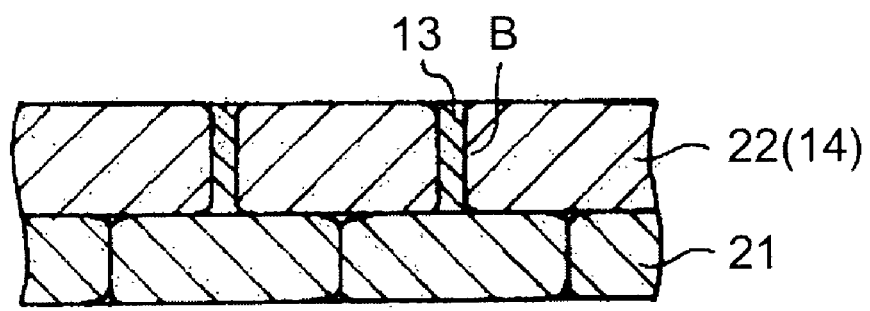

The magnetic metallic element M composing the first layer 21 is absorbed into the crystal grain boundaries B generated by the change of the second layer 22 into the crystalline phase, in addition to the gaps generated by the aggregation of the nonmagnetic metallic element N having the larger surface energy. The magnetic metallic elements M absorbed into the crystal grain boundaries B of the second layer 22 form the magnetic regions 13 locally penetrating the second layer 22 (nonmagnetic region 14) and extending in the film plane perpendicular direction as shown in FIG. 7C. The absorbing phenomenon of the magnetic metallic element M can be generated more certainly by using the difference of the crystalline states of the first layer 21 and the second layer 22, in addition to the difference of the surface energies of the magnetic metallic element M and the nonmagnetic metallic element N.

As shown in FIG. 4B, FIG. 5B, and FIG. 7C, it is possible to form the intermediate layer 6 having the layer-state nonmagnetic region 14 and the magnetic regions 13 locally penetrating the nonmagnetic region 14 and extending in the film plane perpendicular direction, by using the absorbing phenomenon of the magnetic metallic element M based on the difference of the surface energies. It is possible to increase the electrical resistance of the nonmagnetic region 14 up to approximately 10 times to 100 times of the magnetic region 13 according to the metallic elements composing the respective regions 13, 14. There is a case when it is possible to make the magnetic region 13 function as the magnetic microcontact even under the state as it is. However, it is preferable to perform an oxidation process of the nonmagnetic region 14 after the forming process (energy supplying process) of the magnetic region 13 is performed, to increase the electrical resistance of the nonmagnetic region 14.

Figure 4C:
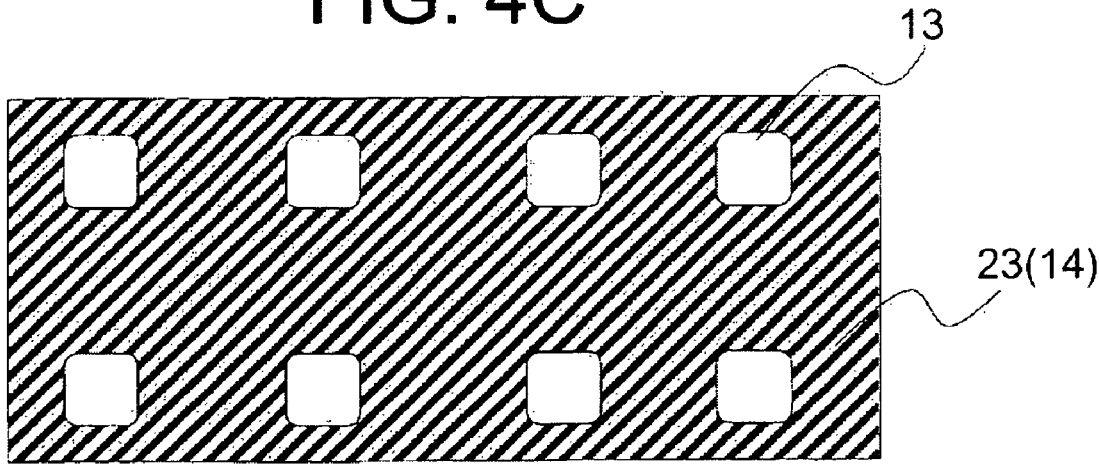
Figure 5C:
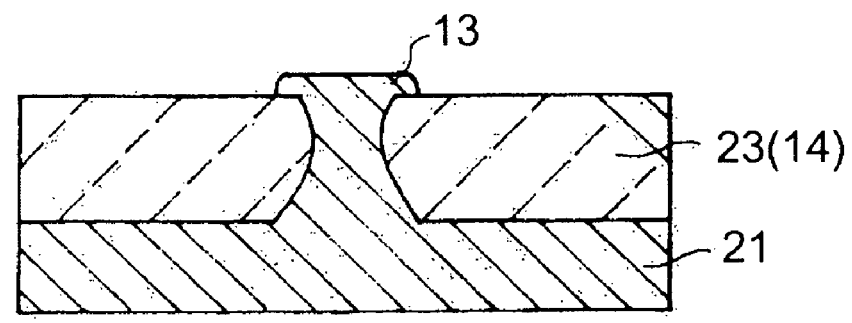

The second layer 22 (nonmagnetic region 14) is selectively oxidized by introducing oxygen into a chamber after the energy supplying process to expose the second layer 22 (nonmagnetic region 14) in an oxygen atmosphere, or by irradiating an oxygen radical. The selective oxidation of the second layer 22 (nonmagnetic region 14) can be realized by using the difference of oxide generation free energies of the nonmagnetic metallic element N and the magnetic metallic element M. It becomes possible to obtain the intermediate layer 6 in which the low-resistance magnetic regions 13 are dotted within the high-resistance nonmagnetic region 14 composed of an oxide layer 23 of the nonmagnetic metallic element N, as shown in FIG. 4C and FIG. 5C by selectively oxidizing the nonmagnetic region 14.

The energy supplying process and the oxidation process are not necessarily performed separately, but they can be performed simultaneously. For example, it is possible to simultaneously perform the respective processes by exposing the nonmagnetic region 14 in the oxygen atmosphere or by irradiating the oxygen radical in parallel with the annealing process to form the magnetic region 13. Further, the energy supplying process and the oxidation process may be performed simultaneously with the deposition process of the second layer 22. For example, the ion beam containing oxygen ion is irradiated on the substrate simultaneously with the deposition of the nonmagnetic metallic element N, and thereby, the deposition process and the oxidation process can be performed simultaneously. The surface energy of the nonmagnetic metallic element N can further be increased by oxidizing the nonmagnetic metallic element N. When the respective processes are performed simultaneously, there is a case when the nonmagnetic metallic element N is oxidized to remain, and composes a part of the high-resistance nonmagnetic region 14.

The process to increase the resistance of the nonmagnetic region 14 is not limited to the oxidation process of the nonmagnetic metallic element N. It is possible to apply a nitridation process, a carbonization process, a fluoridation process, and so on instead of the oxidation process of the nonmagnetic metallic element N. As stated above, at least one kind of process selected from the oxidation, the nitridation, the carbonization, and the fluoridation of the nonmagnetic metallic element N is applied to the process to increase the resistance of the nonmagnetic metallic region 14. These processes can be combined to apply. It is the same when the resistance of the nonmagnetic region 14 is increased simultaneously with the energy supplying process and the deposition process of the nonmagnetic metallic element N, and at least one kind of process selected from the oxidation, the nitridation, the carbonization, and the fluoridation can be used.

Incidentally, the first layer 21 is good enough as long as it can supply the magnetic metallic element M required for the formation of the magnetic region 13, and there is no problem if the first layer 21 remains at a lower side of the intermediate layer (microstructured layer) 6 having the magnetic region 13 and the nonmagnetic region 14 after the magnetic metallic element M is supplied. The magnetic metallic element M exists in the magnetic layer 21 which is disposed at the substrate side than the nonmagnetic region 14 and in the magnetic region 13 formed within the nonmagnetic region 14, and the most part of the magnetic metallic element M exists within the magnetic layer 21, with considering the forming process of the magnetic region 13 within the nonmagnetic region 14 (absorbing process of the magnetic metallic element M).

As stated above, the intermediate layer (microstructured layer) 6 is created by using the absorbing phenomenon of the magnetic metallic element M, and thereby, it becomes possible to form the micro magnetic regions (spin nano-bridges) 13 within the high-resistance nonmagnetic region 14 with good repeatability and controllability. Accordingly, it becomes possible to obtain a giant magnetoresistive effect (BMR) based on the ballistic conduction stably. After the forming process of the intermediate layer 6, the magnetoresistive effect element 1 is created by depositing the second magnetic layer 7, the upper electrode 4, and so on as same as a normal spin-valve type magnetoresistive effect film.

The spin-valve type magnetoresistive effect element 1 having the CPP structure of this embodiment is used as a composing element of a magnetic head and so on as same as the conventional magnetoresistive effect element. The magnetoresistive effect element 1 can be used also as the composing element of a magnetic storage device such as a magnetic random access memory without being limited to the magnetic head. The magnetic head using the magnetoresistive effect element 1 of this embodiment is used for a reading of information magnetically recorded on a magnetic recording medium as a reproducing head. The reproducing head applying the magnetic head of this embodiment can be used by being integrated with a recording head.

Figure 8:
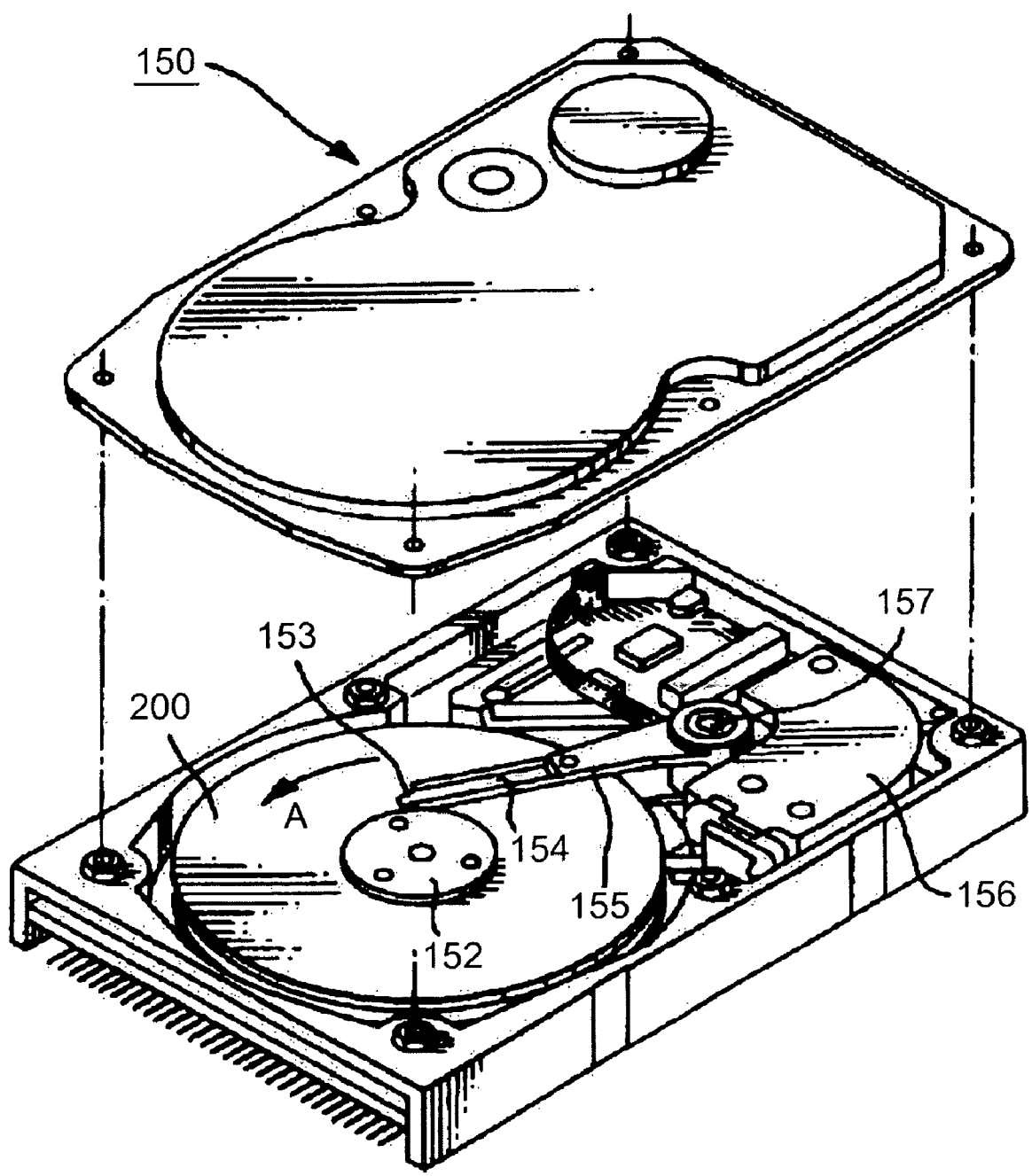
FIG. 8 is a perspective view showing a magnetic reproducing apparatus according to an embodiment.
Figure 9:
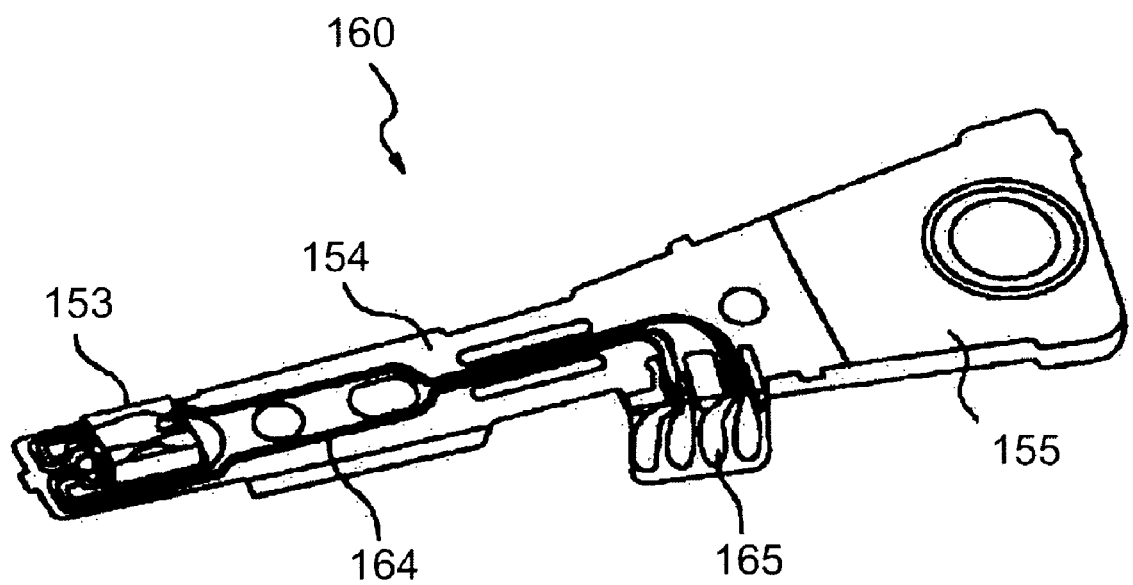
FIG. 9 is a perspective view showing a magnetic head assembly in FIG. 8.

FIG. 8 is a perspective view showing a constitution of an embodiment in which the magnetic reproducing apparatus is applied to a magnetic disk apparatus. FIG. 9 is a perspective view showing a constitution of a magnetic head assembly used for the magnetic disk apparatus shown in FIG. 8. The magnetic head using the magnetoresistive effect element of this embodiment is mounted on a magnetic recording/reproducing apparatus while built in a recording/reproducing integral type magnetic head assembly. A magnetic recording/reproducing apparatus 150 shown in FIG. 8 is an apparatus in which a rotary actuator is used.

In FIG. 8, a medium disk 200 for recording is attached on a spindle 152, and rotates in a direction shown by an arrow "A" by a not-shown motor responding to a control signal from a not-shown driving system controller. The magnetic recording/reproducing apparatus 150 may include plural medium disks 200. A head slider 153 performing a recording/reproducing of information to be stored on the medium disk 200 is attached at a tip portion of a suspension 154 in a thin-film state. The magnetic head applying the magnetoresistive effect element of the above-stated embodiment is mounted on the head slider 153.

When the medium disk 200 rotates, an air bearing surface (ABS) of the head slider 153 is held with a predetermined floating amount from a surface of the medium disk 200. It may be so-called a contact running type in which the air bearing surface is in contact with the medium disk 200. The suspension 154 is connected to one end of an actuator arm 155 having a bobbin part holding a not-shown driving coil. A voice coil motor 156 being one kind of a linear motor is provided at the other end of the actuator arm 155. The voice coil motor 156 is constituted by the not-shown driving coil wound up into the bobbin part of the actuator arm 155, and a magnetic circuit composed of a permanent magnet and a counter yoke placed to face so as to sandwich the driving coil.

The actuator arm 155 is held by not-shown ball bearings provided at two places above and below the spindle 157, and a rotational sliding thereof is enabled by the voice coil motor 156. FIG. 9 is an enlarged perspective view of a tip portion of the magnetic head assembly from the actuator arm 155 when it is viewed from a disk side. A magnetic head assembly 160 includes the actuator arm 155 having the bobbin part holding, for example, the driving coil, and the suspension 154 is connected to one end of the actuator arm 155.

At a tip portion of the suspension 154, the head slider 153 including the magnetoresistive effect element of the above-stated embodiment is attached. The suspension 154 has lead wires 164 for reading/writing signals, and these lead wires 164 and respective electrodes of the magnetic head built in the head slider 153 are electrically connected. Reference numeral 165 in the view shows electrode pads of the magnetic head assembly 160. The magnetic recording/reproducing apparatus 150 of this embodiment includes the magnetoresistive effect element of the above-stated embodiment, and thereby, it is possible to surely read information magnetically recorded on the medium disk 200 with a higher recording density than the conventional one.

Next, a magnetic storage device mounting the magnetoresistive effect element according to the embodiment is described. It is possible to realize the magnetic memory, for example, such as the Magnetic Random Access Memory (MRAM) in which memory cells are disposed in a matrix state, by using the magnetoresistive effect element of the embodiment (for example, the magnetoresistive effect element having the structure shown in FIG. 2).

Figure 10:
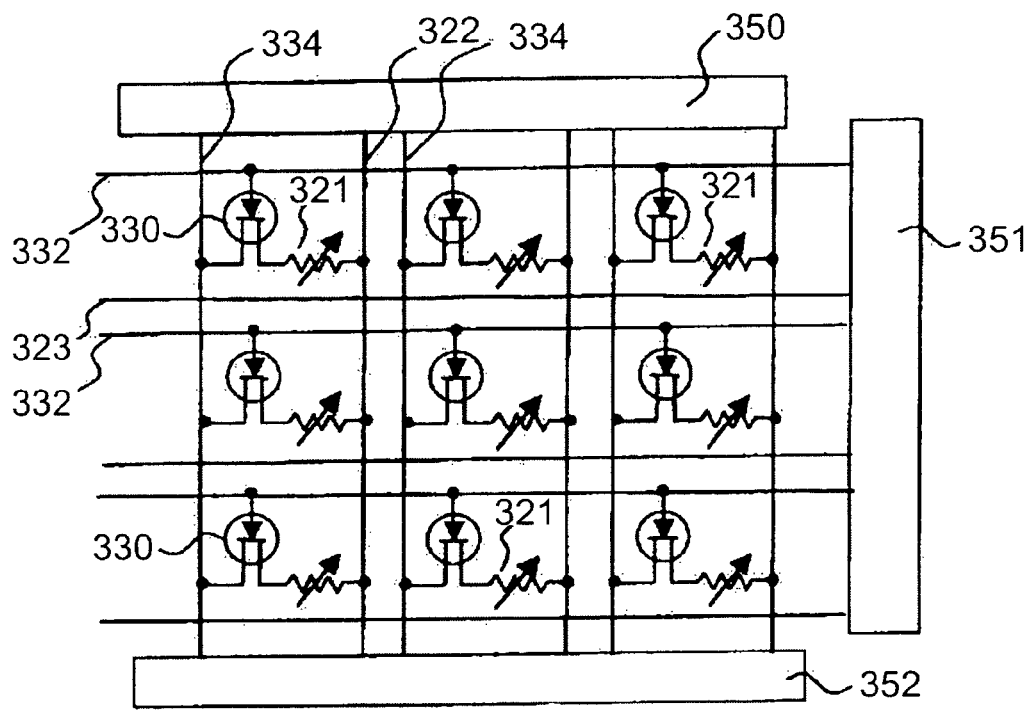
FIG. 10 is a view showing a magnetic memory according to an embodiment.

FIG. 10 is a schematic diagram showing a matrix configuration of the magnetic memory according to the embodiment. This view shows a circuitry when the memory cells are disposed in the array state. A column decoder 350 and a row decoder 351 are included to select one bit within the array. A switching transistor 330 is turned on by a bit line 334 and a word line 332, and the bit is uniquely selected. This bit is detected by a sense amplifier 352, and thereby, bit information recorded at a magnetic recording layer of a magnetoresistive effect element 321 is read. The bit information is written by a magnetic field generated by flowing a write current to a specific write word line 323 and a bit line 322.

Figure 11:
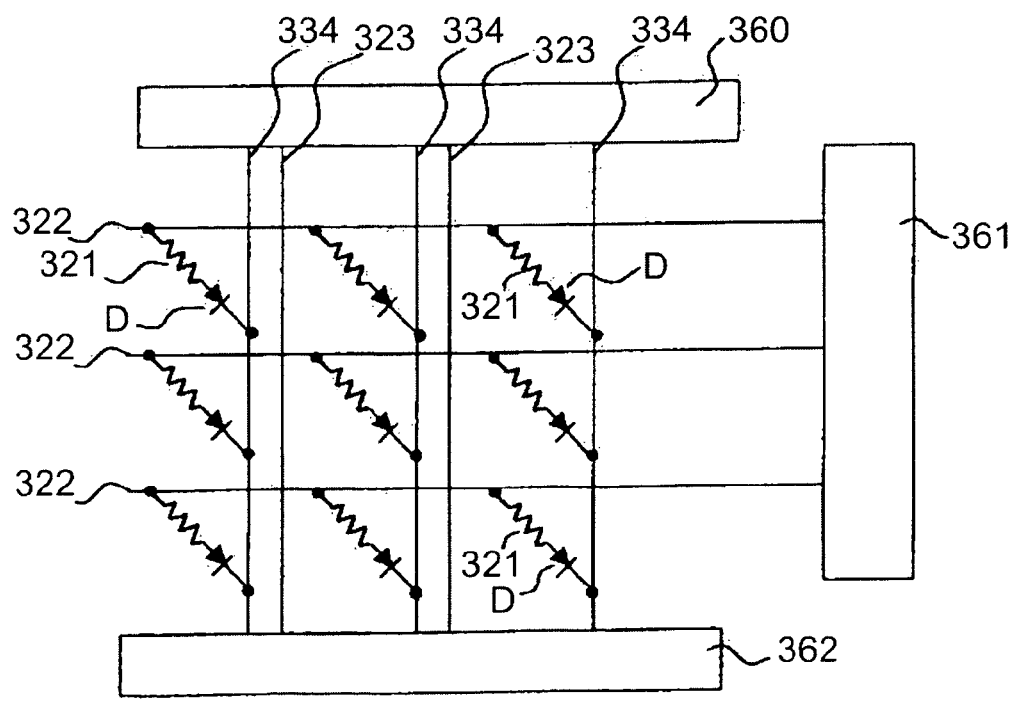
FIG. 11 is a view showing a magnetic memory according to another embodiment.

FIG. 11 is a schematic diagram showing a matrix configuration of a magnetic memory according to another embodiment. In case of the embodiment shown in FIG. 11, bit lines 322 and word lines 332 wired in a matrix state are respectively selected by decoders 360, 361, and a specific memory cell within an array is selected. A memory cell has a structure in which a magnetoresistive effect element 321 and a diode D are connected in series. The diode D prevents that a sense current takes an alternate route at the memory cell other than the selected magnetoresistive effect element 321. Writing is performed by a magnetic field generated by flowing a write current to a specific bit line 322 and write word line 323 respectively.

Figure 12:
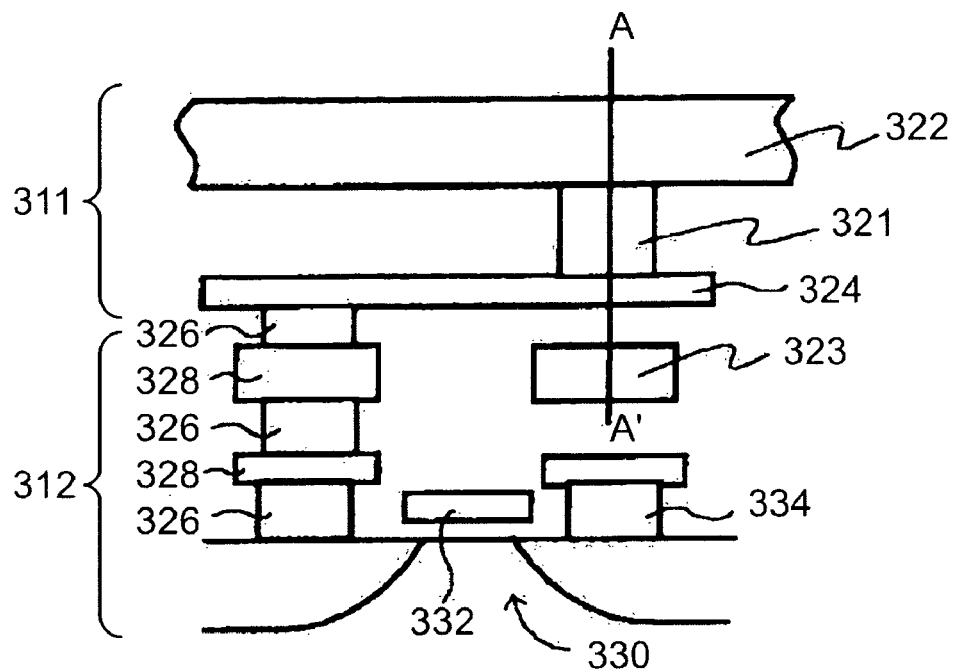
FIG. 12 is a sectional view showing a structure of the magnetic memory according to the embodiment.
Figure 13:
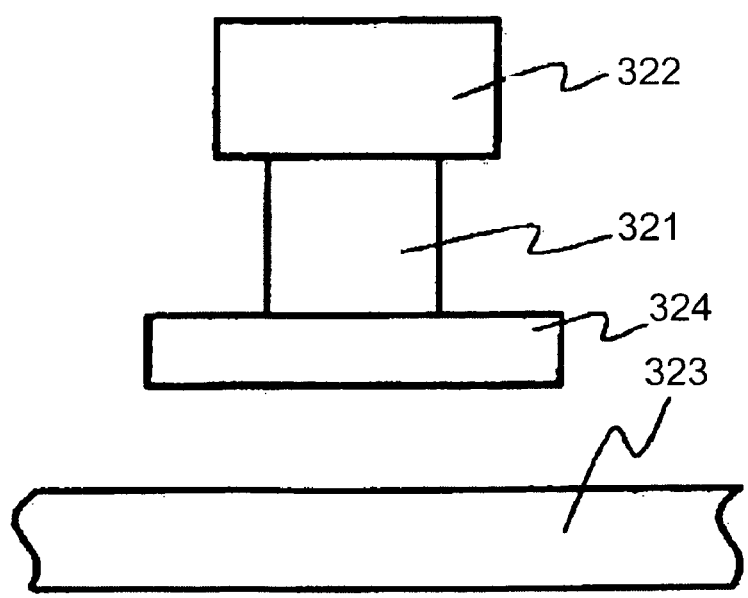
FIG. 13 is a sectional view taken along the line A-A' in FIG. 12.

FIG. 12 is a sectional view showing a structure of the magnetic memory according to the embodiment. FIG. 13 is a sectional view taken along the line A-A' in FIG. 12. The structures shown in these views correspond to one memory cell included in the magnetic memory shown in FIG. 10. It is a memory cell of a one-bit portion of the magnetic memory operating as the random access memory. The memory cell has a storage element portion 311 and an address selection transistor portion 312. The storage element portion 311 has the magnetoresistive effect element 321 and a pair of wirings 322, 324 connected thereto. The magnetoresistive effect element 321 is the element described based on FIG. 1 to FIG. 7.

The sense current is flowed to the magnetoresistive effect element 321 and a resistance change is detected when the bit information is read. The transistor 330 connected through via 326 and embedded wiring 328 is provided at the address selection transistor portion 312. The transistor 330 performs a switching operation in accordance with a voltage applied to a gate 332, to control a gating of a current path between the magnetoresistive effect element 321 and the wiring 334. The write wiring 323 is provided below the magnetoresistive effect element 321 in an approximately orthogonal direction with the wiring 322. These wirings 322, 323 are formed by, for example, aluminum (Al), copper (Cu), tungsten (W), tantalum (Ta), or an alloy containing the above.

When the bit information is written to the magnetoresistive effect element 321, a write pulse current is flowed to the wirings 322, 323, and a magnetization of the recording layer of the magnetoresistive effect element 321 is appropriately reversed by a synthetic magnetic field induced by the write pulse current. When the bit information is read, the sense current is flowed to the magnetoresistive effect element 321 through the wiring 322 and the wiring (lower electrode) 324, a resistance value or a change of the resistance value of the magnetoresistive effect element 321 is measured to thereby perform the reading. The magnetic memory according to this embodiment uses the magnetoresistive effect element described based on FIG. 1 to FIG. 7, and therefore, it is possible to obtain a large magnetoresistive change ratio stably. As a result, it is possible to secure the writing by certainly controlling a magnetic domain of the recording layer, and to perform the reading certainly, even if a cell size is miniaturized.

Next, concrete examples and evaluated results thereof are described. It should be noted that these examples are not intended to limit the present invention.

Example 1

In an example 1, a magnetoresistive effect element having a microstructured layer formed by using a nickel (Ni)-tungsten (W) base laminated film as an intermediate layer is described. As an element structure, the first magnetic layer 5 is made to be the pinned layer and the second magnetic layer 7 is made to be the free layer in FIG. 2. The antiferromagnetic layer 11 is disposed at a lower side of the first magnetic layer 5. Concrete element structure thereof is as follows: the substrate 3 serving also as the lower electrode; the base layer 8; the antiferromagnetic layer 11; the pinned layer 5; the intermediate layer 6; the free layer 7; the protective layer 12; and the upper electrode 4. The pinned layer 5 has a synthetic structure.

The respective layers are deposited by using a DC magnetron sputtering apparatus. Inside of a deposition chamber is exhausted until an ultimate vacuum is to be $10^{-5}$ Pa or less, and the respective layers are deposited with a deposition rate of 0.02 nm/s to 0.1 nm/s. The upper electrode 4 is an approximately circular state with a diameter of 0.5 μm. Film thicknesses and composing materials of the respective layers constituting the magnetoresistive effect element 1 are as shown in the following. Incidentally, reference numerals shown in FIG. 2 and FIG. 5 are attached to the corresponding respective layers in parenthesis.

A structure of the magnetoresistive effect element 1 is as follows: an Si substrate (3); Ta [5 nm] (8); Cu [200 nm] (8); $(Ni_{0.8}Fe_{0.2})_{78}Cr_{22}$ [5 nm] (8); PtMn [10 nm] (11); CoFe [4.0 nm] (5); Ru [0.9 nm] (5); CoFe [4.0 nm] (5); Ni [1.0 nm] (21); W [1.0 nm] (22); CoFe [4.0 nm] (7); Ta [2 nm] (12); and Cu [200 nm] (4).

An absorbing process of a magnetic metallic element (Ni) is carried out by performing a heat treatment at 300° C. for 30 minutes after a laminated film of an Ni layer 21 and a W layer 22 are deposited. In an RHEED observation performed before and after this heat treatment, only spots (crystalline substances) from W existing at the most front surface is observed before the heat treatment, but other spots than the spots from W are observed after the heat treatment although they are weak. An element is identified from this spot interval, and the spot is turned out to come from Ni. It is confirmed that Ni is diffused within the W layer composing the nonmagnetic region 14 by the heat treatment at 300° C. for 30 minutes.

After it is confirmed that Ni diffuses within the W layer, W is selectively oxidized by irradiating an oxygen radical. Subsequently, after the depositions of a CoFe layer as the free layer 7 to a Cu layer as the upper electrode 4 are performed, a heat treatment at 270° C. for 10 hours is performed under a state that a magnetic field of 5 kOe is applied. After that, a magnetoresistive effect element is created by using a normal semiconductor process. A magnetoresistive change ratio MR and an area resistance RA of the magnetoresistive effect element created as stated above are MR=25.0%, RA=0.80 Ωμm².

Figure 14:
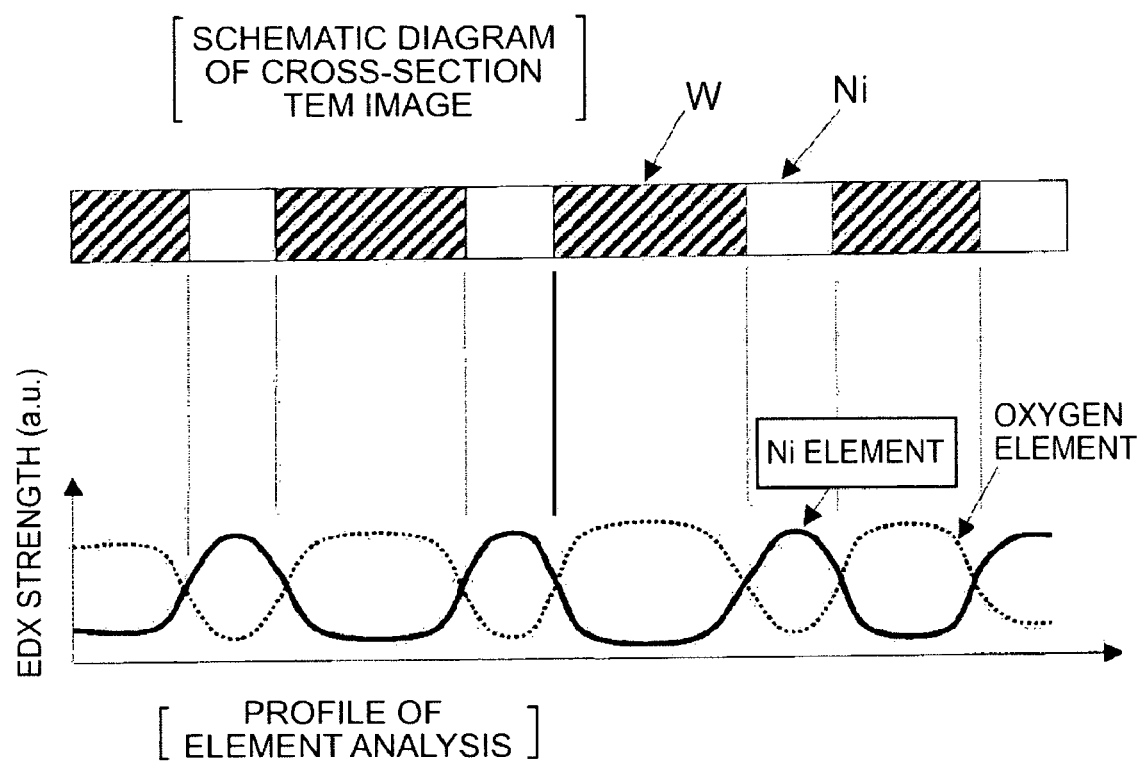
FIG. 14 is a view schematically showing a nano-EDX analysis result of an intermediate layer according to an example 1.

A cross-sectional shape and a composition analysis of the intermediate layer 6 are performed for the magnetoresistive effect element created in the example 1 by a cross-section TEM and a nano-EDX analysis (focus attention on oxygen and Ni within the intermediate layer 6). As a result, it is confirmed that the film thickness of the intermediate layer 6 is approximately 2.5 nm by the cross-section TEM. Further, it is confirmed that Ni absorbed in the W layer is in a trapezoid state, and a tip side thereof is spreading out in a terrace form on the W layer. A size of an Ni region is approximately 3 nm at the pinned layer 5 side, approximately 1 nm at the free layer 7 side, and formation intervals thereof are generally 30 nm to 50 nm. Further, an analysis result by the nano-EDX analysis is schematically shown in FIG. 14. As a result of the nano-EDX analysis, it turned out that there is barely oxygen in Ni.

Incidentally, element characteristics are examined as for cases when Nb, V, Ta, Mo, Ti, Zr, and Hf having a larger surface energy than Ni are used instead of the Ni—W base by similarly creating the magnetoresistive effect element. As a result, the good magnetoresistive change ratio and the appropriate area resistance can be obtained as same as the Ni—W base. When the magnetoresistive effect element is created by using Fe, Co, and an alloy thereof instead of Ni, the good result can be obtained as same as Ni.

Example 2

In an example 2, a magnetoresistive effect element having the similar structure with the example 1 is created. A deposition method of respective layers is generally the same as the one in the example 1. Film thicknesses and composing materials of the respective layers composing the magnetoresistive effect element of the example 2 are as shown in the following. Namely, a layer structure thereof is: an Si substrate (3); Ta [5 nm] (8); Cu [200 nm] (8); $(Ni_{0.8}Fe_{0.2})_{78}Cr_{22}$ [5 nm] (8); PtMn [10 nm] (11); CoFe [2.5 nm] (5); Ru [0.9 nm] (5); CoFe [2.5 nm] (5); Fe [1.0 nm] (21); Ta [2.0 nm] (22); CoFe [3.0 nm] (7); Ta [2 nm] (12); and Cu [200 nm] (4).

An absorbing process of a magnetic metallic element (Fe) is carried out by performing a heat treatment at 300° C. for 30 minutes after a laminated film of an Fe layer 21 and a Ta layer 22 are deposited. A change of a crystalline state of the Ta layer (phase change from an amorphous phase to a crystalline phase) and a diffusion of Fe into Ta are simultaneously performed by this heat treatment. After that, a selective oxidation process of Ta is performed by introducing oxygen into a deposition chamber. In this case also, surface states after the deposition of Fe, after the deposition of Ta, and after the oxidation process and the diffusion are observed by the RHEED as same as in the example 1. As a result, spots corresponding to Fe are observed from an RHEED pattern just after the deposition of Fe, but the RHEED pattern after the deposition of Ta is a ring, and therefore, it is confirmed that Ta is in an amorphous state.

From the RHEED pattern after the heat treatment, the spots corresponding to bcc-Fe and ring patterns corresponding to bcc-Ta with low crystallinity are simultaneously observed. It is confirmed that Ta in the amorphous state is phase changed into the crystalline state, and further, Fe is absorbed into the crystalline Ta in a process of the phase change from the above. Subsequently, after the depositions of a CoFe layer as the free layer 7 to a Cu layer as the upper electrode 4 are performed, the heat treatment at 270° C. for 10 hours is performed under a state that a magnetic field of 5 kOe is applied. After that, a magnetoresistive effect element is created by using a normal semiconductor process.

Characteristics of the magnetoresistive effect element obtained as stated above are MR=15.0%, RA=0.70 $\Omega\mu m^2$. In the example 2, it is conceivable that an absorbing phenomenon of Fe is occurred based on the phase change of Ta from the amorphous phase to the crystalline phase in addition that the surface energy of Ta is larger than the surface energy of Fe. Incidentally, a magnetoresistive effect element having similarly good element characteristics can be obtained in cases when Ni, Co, and an alloy thereof are used instead of Fe. It is also the same in the case when Nb, V, Mo, W, Ti, Zr, and Hf are used instead of Ta.

It should be noted that the present invention is not limited to the above-described embodiments, and in an implementation stage, it can be embodied by modifying components thereof within a range not departing from the spirit of the invention. Also, the plural components disclosed in the above-described embodiments can be appropriately combined to form various inventions. For example, some of all the components shown in the embodiments may be eliminated. Moreover, components from different embodiments may be combined appropriately.

What is claimed is:

1. A magnetoresistive effect element, comprising:
   a magnetoresistive effect film including,
   a pinned layer having a ferromagnetic film of which magnetization direction is fixed substantially in one direction,
   a free layer having a ferromagnetic film of which magnetization direction changes in accordance with an external magnetic field, and
   an intermediate layer which is interposed between the pinned layer and the free layer, and has a magnetic region and a nonmagnetic region whose electrical resistance is higher than the magnetic region, and in which the nonmagnetic region contains a nonmagnetic metallic element having a larger surface energy than a magnetic metallic element contained in the magnetic region; and
   a pair of electrodes provided to pass a sense current in a direction substantially perpendicular to a film plane of the magnetoresistive effect film.

2. The element according to claim 1,
   wherein the magnetic region penetrates the nonmagnetic region locally and extends in the direction substantially perpendicular to the film plane to connect the pinned layer and the free layer.

3. The element according to claim 2,
   wherein an upper end portion of the magnetic region spreads out in a terrace form on the nonmagnetic region.

4. The element according to claim 1,
   wherein the magnetic region contains at least one magnetic metallic element selected from Fe, Ni, and Co, and the nonmagnetic region contains at least one nonmagnetic metallic element selected from Nb, V, Ta, Mo, W, Ti, Zr, and Hf.

5. The element according to claim 1,
   wherein the nonmagnetic region is composed of at least one selected from an oxide, a nitride, a carbide, and a fluoride of the nonmagnetic metallic element.

6. The element according to claim 1,
   wherein the magnetic region has a minimum size within a range of 0.1 times to 5 times relative to a film thickness of the intermediate layer.

7. The element according to claim 1,
   wherein the intermediate layer has a film thickness in a range from 0.5 nm to 5 nm.

8. A magnetic head, comprising:
   a reproducing element including the magnetoresistive effect element according to claim 1.

9. A magnetic reproducing apparatus, comprising:
   a magnetic recording medium; and
   a magnetic head reproducing information magnetically recorded on the magnetic recording medium, and having the magnetoresistive effect element according to claim 1.

10. A magnetic memory, comprising:
    the magnetoresistive effect element according to claim 1;
    a write wiring storing information on the magnetoresistive effect element; and
    a read wiring reproducing information stored on the magnetoresistive effect element.

* * * * *